US008516349B2

(12) United States Patent
Yu et al.

(10) Patent No.: US 8,516,349 B2
(45) Date of Patent: Aug. 20, 2013

(54) GENERATION AND APPLICATION OF A SUB-CODEBOOK OF AN ERROR CONTROL CODING CODEBOOK

(75) Inventors: Dong-Sheng Yu, Ottawa (CA); Hosein Nikopourdeilami, Ottawa (CA); Mo-Han Fong, Ottawa (CA)

(73) Assignee: Microsoft Corporation, Redmond, WA (US)

( * ) Notice: Subject to any disclaimer, the term of this patent is extended or adjusted under 35 U.S.C. 154(b) by 187 days.

(21) Appl. No.: 12/874,696

(22) Filed: Sep. 2, 2010

(65) Prior Publication Data

US 2012/0060069 A1 Mar. 8, 2012

(51) Int. Cl.
*H03M 13/00* (2006.01)
(52) U.S. Cl.
USPC .......................................... 714/781; 714/793
(58) Field of Classification Search
USPC .................................................. 714/781, 793
See application file for complete search history.

(56) References Cited

U.S. PATENT DOCUMENTS

| 8,255,781 B2 * | 8/2012 | Chang et al. .................. 714/793 |
| 2005/0117628 A1 | 6/2005 | Brethour et al. |
| 2009/0154333 A1 | 6/2009 | Sivaswamy et al. |

FOREIGN PATENT DOCUMENTS

| EP | 1039716 A1 | 9/2000 |
| EP | 10856545 | 6/2013 |
| KR | 2008/084995 A1 * | 7/2008 |
| WO | WO 02/099788 A1 | 12/2002 |

OTHER PUBLICATIONS

Chau, "International Search Report and Written Opinion"; issued in corresponding International Patent Application No. PCT/CA2010/001367; mailed on May 24, 2011; six pages.
Fong, Mo-Han et al., "Concatenated Orthogonal/PN Codes for DS-CDMA Systems in a Multi-User and Multipath Fading Environment", *IEEE*, (1994), pp. 1642-1646.
Fong, Mo-Han et al., "Concatenated Orthogonal/PN Spreading Sequences and Their Application to Cellulary DS-CDMA Systems with Integrated Traffic" *IEEE Journal on Selected Areas in Communications*, vol. 14, No. 3, (Apr. 1996), pp. 547-558.
Fong, Mo-Han et al., "Line Rate(s) Selection for Cellular DS-CDMA Systems With Integrated Traffic", *IEEE*, 1995, (1998), pp. 1809-1813.
Fong, Mo-Han et al., "Multi-mode Access System with Anchor Layer 2/3 Protocol for Beyond 3G Wireless Networks", *IEEE*, 2006, pp. 172-176.
Hu, Rose Q., et al., "On the Evolution of Handoff Management and Network Architecture in WiMAX", *IEEE*, 2007, pp. 144-149.
Iwamura, Mikio et al., "Carrier Aggregation Framework in 3GPP LTE-Advanced", *IEEE Communication Magazine*, (Aug. 2010), pp. 60-67.
Wah, Chan C., et al., "Distributed Staff Directory System for a Campus", *Proceedings of IEEE Singapore International Conference on Networks*, 1993, 4 pages.

* cited by examiner

*Primary Examiner* — Sam Rizk
(74) *Attorney, Agent, or Firm* — Wolfe-SBMC

(57) ABSTRACT

There is provided a method of encoding and decoding data using an error control code having a codebook G. The codebook G is a sub-codebook of a codebook P. Each codeword g in the sub-codebook G has an autocorrelation amplitude that is different from and higher than each correlation amplitude between g and each of the other codewords in the sub-codebook G. In one specific embodiment in which the codebook P is that of a Reed-Muller code, using G instead of P reduces the likelihood of the presence of more than one maximum correlation amplitude when computing the non-coherent decision metric during decoding.

20 Claims, 14 Drawing Sheets

GENERATION AND APPLICATION OF A SUB-CODEBOOK OF AN ERROR CONTROL CODING CODEBOOK

FIELD

This application relates to wireless communication techniques in general, and to the techniques of this disclosure, in particular.

BACKGROUND

A detector in a receiver in a data communication system can implement either coherent detection or non-coherent detection. In coherent detection, the detector has knowledge of the phase of the carrier signal, and uses this knowledge to improve detection. In non-coherent detection, the detector does not have such information and must therefore try and cancel out any phase discrepancy (e.g. using a differential detection scheme), or apply other non-coherent detection methods known in the art.

A receiver that performs coherent detection offers many advantages. However, there may be situations in which non-coherent detection is necessary (due to the capabilities of the receiver), or is even preferred over coherent detection. It is therefore desirable to develop communication schemes suitable for use with a non-coherent detector.

In Draft IEEE 802.16m System Description Document, IEEE 802.16m-081003r1, dated Apr. 15, 2008, it is stated that:

This [802.16 m] standard amends the IEEE 802.16 WirelessMAN-OFDMA specification to provide an advanced air interface for operation in licensed bands. It meets the cellular layer requirements of IMT-Advanced next generation mobile networks. This amendment provides continuing support for legacy WirelessMAN-OFDMA equipment.

And the standard will address the following purpose:

i. The purpose of this standard is to provide performance improvements necessary to support future advanced services and applications, such as those described by the ITU in Report ITU-R M.2072.

SUMMARY

In general terms, there is provided a method of encoding data using an error control code. The method comprises: mapping a sequence of the data to a codeword from a codebook G of the error control code; and forwarding the codeword for transmission over the channel. The codebook G is a sub-codebook of a codebook P. Each codeword g in the sub-codebook G has an autocorrelation amplitude that is different from and higher than each correlation amplitude between g and each of the other codewords in the sub-codebook G.

In one embodiment, the method for generating G comprises: (a) establishing an empty sub-codebook G; (b) selecting a codeword from codebook P and including the codeword from codebook P in sub-codebook G; (c) computing an autocorrelation amplitude of the codeword from codebook P; (d) computing a correlation amplitude between the codeword from codebook P and each codeword in codebook P, and deleting from codebook P each codeword in codebook P in which the correlation amplitude is equal to the auto-correlation amplitude; and (e) repeating operations (b) to (d) until all of the plurality of codewords are deleted from codebook P.

In one specific embodiment, using the technique above, a new codebook G can be constructed, which is a sub-codebook of a Reed-Muller codebook P. Data is then encoded using G rather than P.

There is also provided a method of decoding a sequence of data received over a communication channel, the sequence having been encoded using an error control code prior to transmission over the channel. The method is performed in a receiver and comprises: obtaining the sequence of data that was received over the communication channel; for each codeword in a codebook G of the error control code, computing a correlation value between the sequence and the codeword; and selecting the codeword in the codebook G resulting in the highest correlation value. The codebook G is a sub-codebook of a codebook P. Each codeword g in the sub-codebook G has an autocorrelation amplitude that is different from and higher than each correlation amplitude between g and each of the other codewords in the sub-codebook G.

There is further provided a device in a data communication system configured to encode data using an error control code. The device comprises: memory for storing a codebook G of the error control code; an encoder configured to map a sequence of the data to a codeword from the codebook G; and transmit circuitry for transmitting the codeword over a channel. The codebook G is a sub-codebook of a codebook P. Each codeword g in the sub-codebook G has an autocorrelation amplitude that is different from and higher than each correlation amplitude between g and each of the other codewords in the sub-codebook G.

There is also provided a device in a data communication system configured to decode a sequence of data received over a communication channel, the sequence having been encoded using an error control code prior to transmission over the channel. The device comprises: receive circuitry for receiving the sequence of data from the channel; memory for storing a codebook G of the error control code; and a decoder configured to compute, for each codeword in the codebook G, a correlation value between the sequence and the codeword, and selecting the codeword in the codebook G resulting in the highest correlation value. The codebook G is a sub-codebook of a codebook P. Each codeword g in the sub-codebook G has an autocorrelation amplitude that is different from and higher than each correlation amplitude between g and each of the other codewords in the sub-codebook G.

There is further provided a computer-readable medium having stored thereon computer-readable instructions for performing a method of encoding data using an error control code. The computer-readable instructions including instructions for performing operations comprising: mapping a sequence of the data to a codeword from a codebook G of the error control code; and forwarding the codeword for transmission over a channel. The codebook G is a sub-codebook of another codebook P, and each codeword g in the sub-codebook G has an autocorrelation amplitude that is different from and higher than each correlation amplitude between g and each of the other codewords in the sub-codebook G.

There is also provided a computer-readable medium having stored thereon computer-readable instructions for performing a method of decoding a sequence of data received over a communication channel, the sequence having been encoded using an error control code prior to transmission over the channel, the computer-readable instructions including instructions for performing operations comprising: obtaining the sequence of data that was received over the communication channel; for each codeword in a codebook G of the error control code, computing a correlation value between the sequence and the codeword; and selecting the codeword in the codebook G resulting in the highest correlation value. The codebook G is a sub-codebook of another codebook P, and each codeword g in the sub-codebook G has an autocorrelation amplitude that is different from and higher than each correlation amplitude between g and each of the other codewords in the sub-codebook G.

A processing unit configured to perform the method of generating G from P, as well as a computer-readable medium having instructions stored thereon for performing the method of generating G from P are also provided.

Aspects and features of the present application will become apparent to those ordinarily skilled in the art upon review of the following description of specific embodiments of the disclosure in conjunction with the accompanying drawings.

BRIEF DESCRIPTION OF THE DRAWINGS

Embodiments of the present application will now be described, by way of example only, with reference to the accompanying figures wherein.

Like reference numerals are used in different figures to denote similar elements.

DETAILED DESCRIPTION

For illustrative purposes, embodiments will now be explained in greater detail below in the context of specific wireless systems.

The embodiments set forth below represent the necessary information to enable those skilled in the art to practice the invention and illustrate the best mode of practicing the invention. Upon reading the following description in light of the accompanying figures, those skilled in the art will understand the concepts of the invention and will recognize applications of these concepts not particularly addressed herein. It should be understood that these concepts and applications fall within the scope of the disclosure and the accompanying claims.

Moreover, it will be appreciated that that any module, component, or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Any application or module herein described may be implemented using computer readable/executable instructions that may be stored or otherwise held by such computer readable media.

Wireless System Overview

Figure 1:
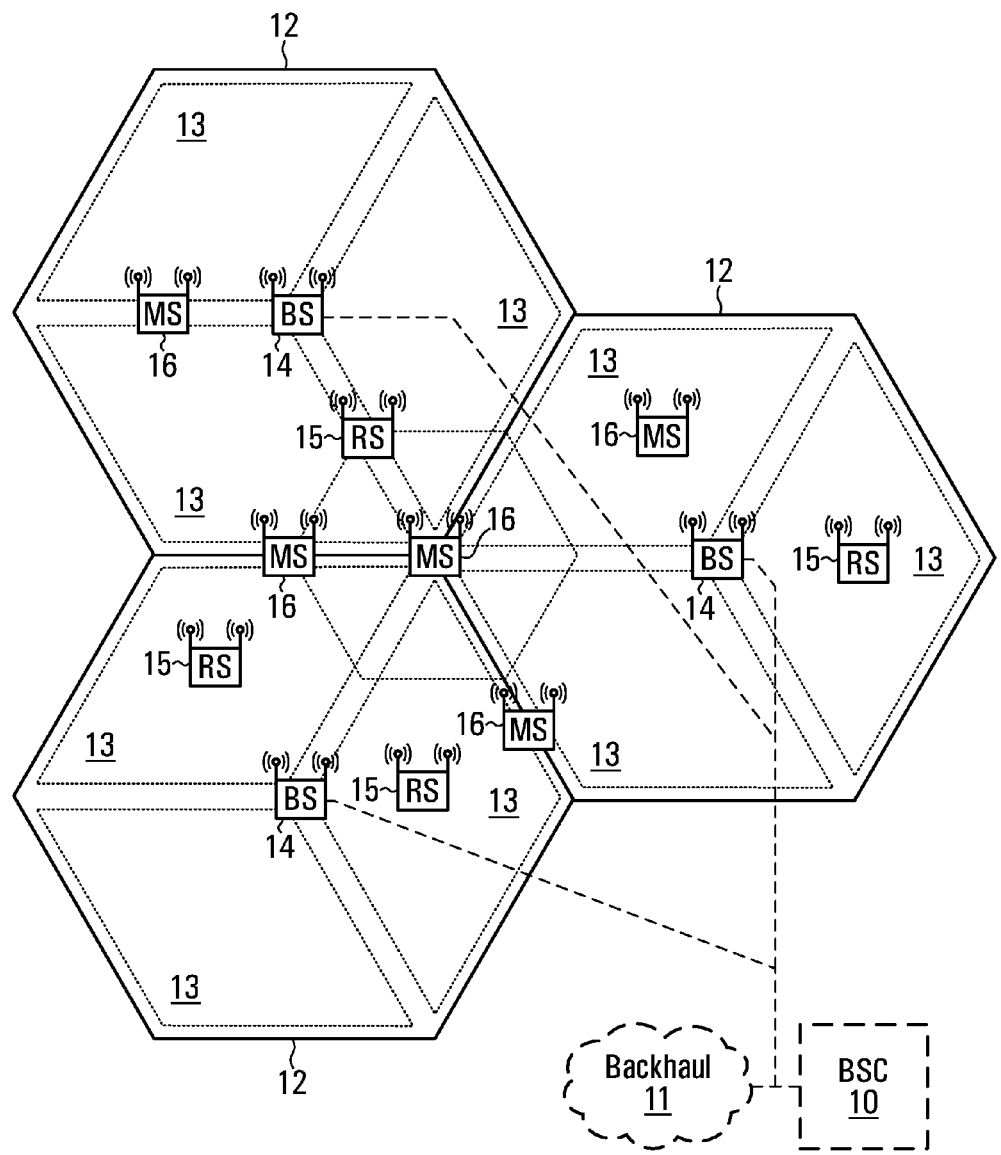
FIG. 1 is a block diagram of a cellular communication system.

Referring now to the drawings, FIG. 1 shows a base station controller (BSC) 10 which controls wireless communications within multiple cells 12, which cells are served by corresponding base stations (BS) 14. In some configurations, each cell is further divided into multiple sectors 13 or zones (not shown). In general, each base station 14 facilitates communications using Orthogonal Frequency-Division Multiplexing (OFDM) with mobile and/or wireless terminals 16, which are within the cell 12 associated with the corresponding base station 14. The movement of the mobile terminals 16 in relation to the base stations 14 results in significant fluctuation in channel conditions. As illustrated, the base stations 14 and mobile terminals 16 may include multiple antennas to provide spatial diversity for communications. In some configurations, relay stations 15 may assist in communications between base stations 14 and wireless terminals 16. Wireless terminals 16 can be handed off from any cell 12, sector 13, zone (not shown), base station 14 or relay 15 to another cell 12, sector 13, zone (not shown), base station 14 or relay 15. In some configurations, base stations 14 communicate with each and with another network (such as a core network or the internet, both not shown) over a backhaul network 11. In some configurations, a base station controller 10 is not needed.

Figure 2:
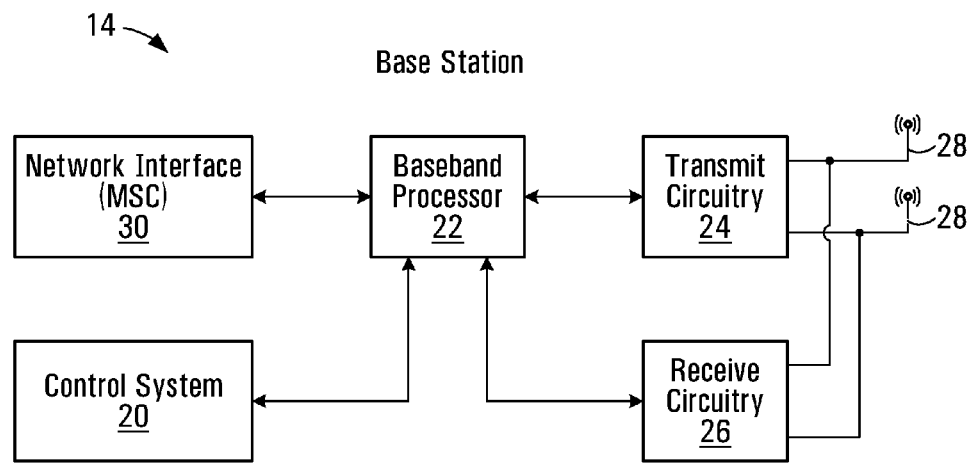
FIG. 2 is a block diagram of an example base station that might be used to implement some embodiments of the present application.

With reference to FIG. 2, an example of a base station 14 is illustrated. The base station 14 generally includes a control system 20, a baseband processor 22, transmit circuitry 24, receive circuitry 26, multiple antennas 28, and a network interface 30. The receive circuitry 26 receives radio frequency signals bearing information from one or more remote transmitters provided by mobile terminals 16 (illustrated in FIG. 3) and relay stations 15 (illustrated in FIG. 4). A low noise amplifier and a filter (not shown) may cooperate to amplify and remove broadband interference from the signal for processing. Down conversion and digitization circuitry (not shown) will then down convert the filtered, received signal to an intermediate or baseband frequency signal, which is then digitized into one or more digital streams.

The baseband processor 22 processes the digitized received signal to extract the information or data bits conveyed in the received signal. This processing typically comprises demodulation, decoding, and error correction operations. As such, the baseband processor 22 is generally implemented in one or more digital signal processors (DSPs) or application-specific integrated circuits (ASICs). The received information is then sent across a wireless network via the network interface 30 or transmitted to another mobile terminal 16 serviced by the base station 14, either directly or with the assistance of a relay 15.

On the transmit side, the baseband processor 22 receives digitized data, which may 20 represent voice, data, or control information, from the network interface 30 under the control of control system 20, and encodes the data for transmission. The encoded data is output to the transmit circuitry 24, where it is modulated by one or more carrier signals having a desired transmit frequency or frequencies. A power amplifier (not shown) will amplify the modulated carrier signals to a level appropriate for transmission, and deliver the modulated carrier signals to the antennas 28 through a matching network (not shown). Modulation and processing details are described in greater detail below.

Figure 3:
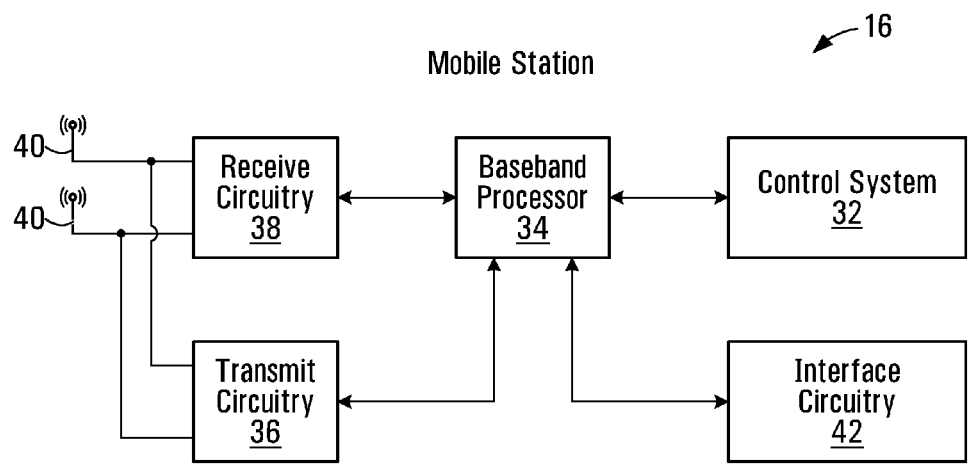
FIG. 3 is a block diagram of an example wireless terminal that might be used to implement some embodiments of the present application.

With reference to FIG. 3, an example of a mobile terminal 16 is illustrated. Similarly to the base station 14, the mobile terminal 16 will include a control system 32, a baseband processor 34, transmit circuitry 36, receive circuitry 38, multiple antennas 40, and user interface circuitry 42. The receive circuitry 38 receives radio frequency signals bearing information from one or more base stations 14 and relays 15. A low noise amplifier and a filter (not shown) may cooperate to amplify and remove broadband interference from the signal for processing. Down conversion and digitization circuitry (not shown) will then down convert the filtered, received signal to an intermediate or baseband frequency signal, which is then digitized into one or more digital streams.

The baseband processor 34 processes the digitized received signal to extract the information or data bits conveyed in the received signal. This processing typically comprises demodulation, decoding, and error correction operations. The baseband processor 34 is generally implemented in one or more digital signal processors (DSPs) and application specific integrated circuits (ASICs).

For transmission, the baseband processor 34 receives digitized data, which may represent voice, video, data, or control information, from the control system 32, which it encodes for transmission. The encoded data is output to the transmit circuitry 36, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 40 through a matching network (not shown). Various modulation and processing techniques available to those skilled in the art are used for signal transmission between the mobile terminal and the base station, either directly or via the relay station.

In one embodiment, the baseband processor 34 uses a new sub-codebook generated from a codebook of an error control code to encode data to be sent to base station 14 or relay 15. This is described in further detail below with reference to FIG. 14. As will be explained in detail below, the data encoded using the new sub-codebook may be, for example, control packet(s) sent on the uplink channel from the mobile terminal 16.

In OFDM modulation, the transmission band is divided into multiple, orthogonal carrier waves. Each carrier wave is modulated according to the digital data to be transmitted. Because OFDM divides the transmission band into multiple carriers, the bandwidth per carrier decreases and the modulation time per carrier increases. Since the multiple carriers are transmitted in parallel, the transmission rate for the digital data, or symbols, on any given carrier is lower than when a single carrier is used.

OFDM modulation utilizes the performance of an Inverse Fast Fourier Transform (IFFT) on the information to be transmitted. For demodulation, the performance of a Fast Fourier Transform (FFT) on the received signal recovers the transmitted information. In practice, the IFFT and FFT are provided by digital signal processing carrying out an Inverse Discrete Fourier Transform (IFFT) and Discrete Fourier Transform (DFT), respectively. Accordingly, the characterizing feature of OFDM modulation is that orthogonal carrier waves are generated for multiple bands within a transmission channel. The modulated signals are digital signals having a relatively low transmission rate and capable of staying within their respective bands. The individual carrier waves are not modulated directly by the digital signals. Instead, all carrier waves are modulated at once by IFFT processing.

In operation, OFDM is preferably used for at least downlink transmission from the base stations 14 to the mobile terminals 16. Each base station 14 is equipped with "n" transmit antennas 28 (n>=I), and each mobile terminal 16 is equipped with "in" receive antennas 40 (m>=1). Notably, the respective antennas can be used for reception and transmission using appropriate duplexers or switches and are so labelled only for clarity.

When relay stations 15 are used, OFDM is preferably used for downlink transmission from the base stations 14 to the relays 15 and from relay stations 15 to the mobile terminals 16.

Figure 4:
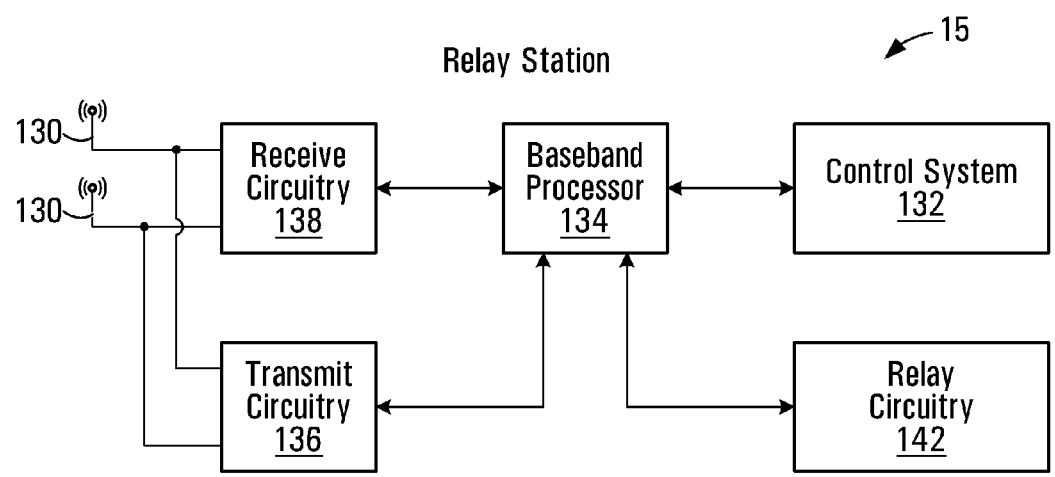
FIG. 4 is a block diagram of an example relay station that might be used to implement some embodiments of the present application.

With reference to FIG. 4, an example of a relay station 15 is illustrated. Similarly to the 25 base station 14, and the mobile terminal 16, the relay station 15 will include a control system 132, a baseband processor 134, transmit circuitry 136, receive circuitry 138, multiple antennas 130, and relay circuitry 142. The relay circuitry 142 enables the relay 15 to assist in communications between a base station 14 and mobile terminals 16. The receive circuitry 138 receives radio frequency signals bearing information from one or more base stations 14 and mobile terminals 16. A low noise amplifier and a filter (not shown) may cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 134 processes the digitized received signal to extract the information or data bits conveyed in the received signal. This processing typically comprises demodulation, decoding, and error correction operations. The baseband processor 134 is generally implemented in one or more digital signal processors (DSPs) and application specific integrated circuits (ASICs).

For transmission, the baseband processor 134 receives digitized data, which may represent voice, video, data, or control information, from the control system 132, which it encodes for transmission. The encoded data is output to the transmit circuitry 136, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 130 through a matching network (not shown). Various modulation and processing techniques available to those skilled in the art are used for signal transmission between the mobile terminal and the base station, either directly or indirectly via a relay station, as described above.

Figure 5:
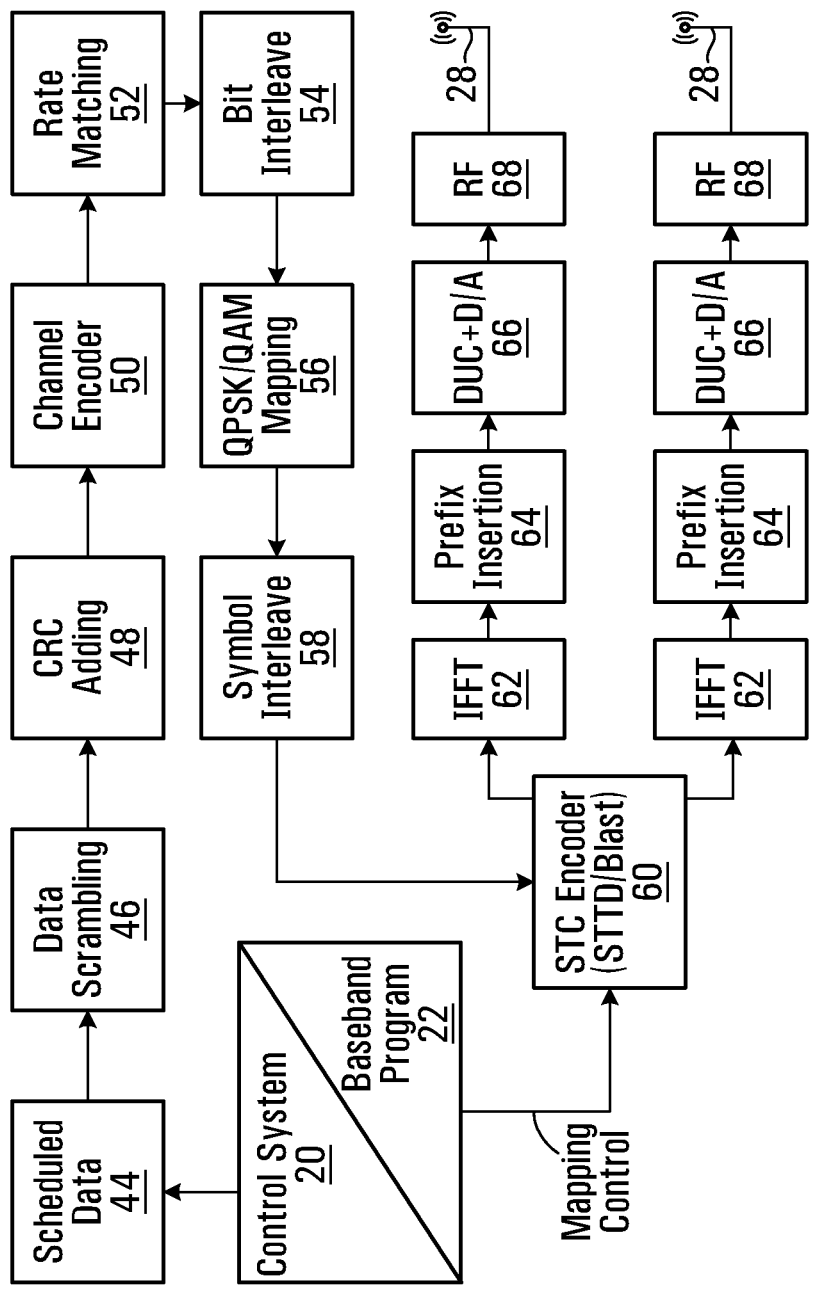
FIG. 5 is a block diagram of a logical breakdown of an example OFDM transmitter architecture that might be used to implement some embodiments of the present application.

With reference to FIG. 5, a logical OFDM transmission architecture will be described. Initially, the base station controller 10 will send data to be transmitted to various mobile terminals 16 to the base station 14, either directly or with the assistance of a relay station 15. The base station 14 may use the channel quality indicators (CQIs) associated with the mobile terminals to schedule the data for transmission as well as select appropriate coding and modulation for transmitting the scheduled data. The CQIs may be directly from the mobile terminals 16 or determined at the base station 14 based on information provided by the mobile terminals 16. In either case, the CQI for each mobile terminal 16 is a function of the degree to which the channel amplitude (or response) varies across the OFDM frequency band.

Scheduled data 44, which is a stream of bits, is scrambled in a manner reducing the peak-to-average power ratio associated with the data using data scrambling logic 46. A cyclic redundancy check (CRC) for the scrambled data is determined and appended to the scrambled data using CRC adding logic 48. Next, channel coding is performed using channel encoder logic 50 to effectively add redundancy to the data to facilitate recovery and error correction at the mobile terminal 16. The encoded data is then processed by rate matching logic 52 to compensate for the data expansion associated with encoding.

Bit interleaver logic 54 systematically reorders the bits in the encoded data to minimize the loss of consecutive data bits. The resultant data bits are systematically mapped into corresponding symbols depending on the chosen baseband modulation by mapping logic 56. Preferably, Quadrature Amplitude Modulation (QAM) or Quadrature Phase Shift Key (QPSK) modulation is used. The degree of modulation is preferably chosen based on the CQI for the particular mobile terminal. The symbols may be systematically reordered to further bolster the immunity of the transmitted signal to periodic data loss caused by frequency selective fading using symbol interleaver logic 58.

At this point, groups of bits have been mapped into symbols representing locations in an amplitude and phase constellation. When spatial diversity is desired, blocks of symbols are then processed by space-time block code (STC) encoder logic 60, which modifies the symbols in a fashion making the transmitted signals more resistant to interference and more readily decoded at a mobile terminal 16. The STC encoder logic 60 will process the incoming symbols and provide "n" outputs corresponding to the number of transmit antennas 28 for the base station 14. The control system 20 and/or baseband processor 22 as described above with respect to FIG. 5 will provide a mapping control signal to control STC encoding. At this point, assume the symbols for the "n" outputs are representative of the data to be transmitted and capable of being recovered by the mobile terminal 16.

For the present example, assume the base station 14 has two antennas 28 (n=2) and the STC encoder logic 60 provides two output streams of symbols. Accordingly, each of the symbol streams output by the STC encoder logic 60 is sent to a corresponding IFFT processor 62, illustrated separately for ease of understanding. Those skilled in the art will recognize that one or more processors may be used to provide such digital signal processing, alone or in combination with other processing described herein. The IFFT processors 62 will preferably operate on the respective symbols to provide an inverse Fourier Transform. The output of the IFFT processors 62 provides symbols in the time domain. The time domain symbols are grouped into frames, which are associated with a prefix by prefix insertion logic 64. Each of the resultant signals is up-converted in the digital domain to an intermediate frequency and converted to an analog signal via the corresponding digital up-conversion (DUC) and digital-to-analog (D/A) conversion circuitry 66. The resultant (analog) signals are then simultaneously modulated at the desired RF frequency, amplified, and transmitted via the RF circuitry 68 and antennas 28. Notably, pilot signals known by the intended mobile terminal 16 are scattered among the sub-carriers. The mobile terminal 16, which is discussed in detail below, will use the pilot signals for channel estimation.

Figure 6:
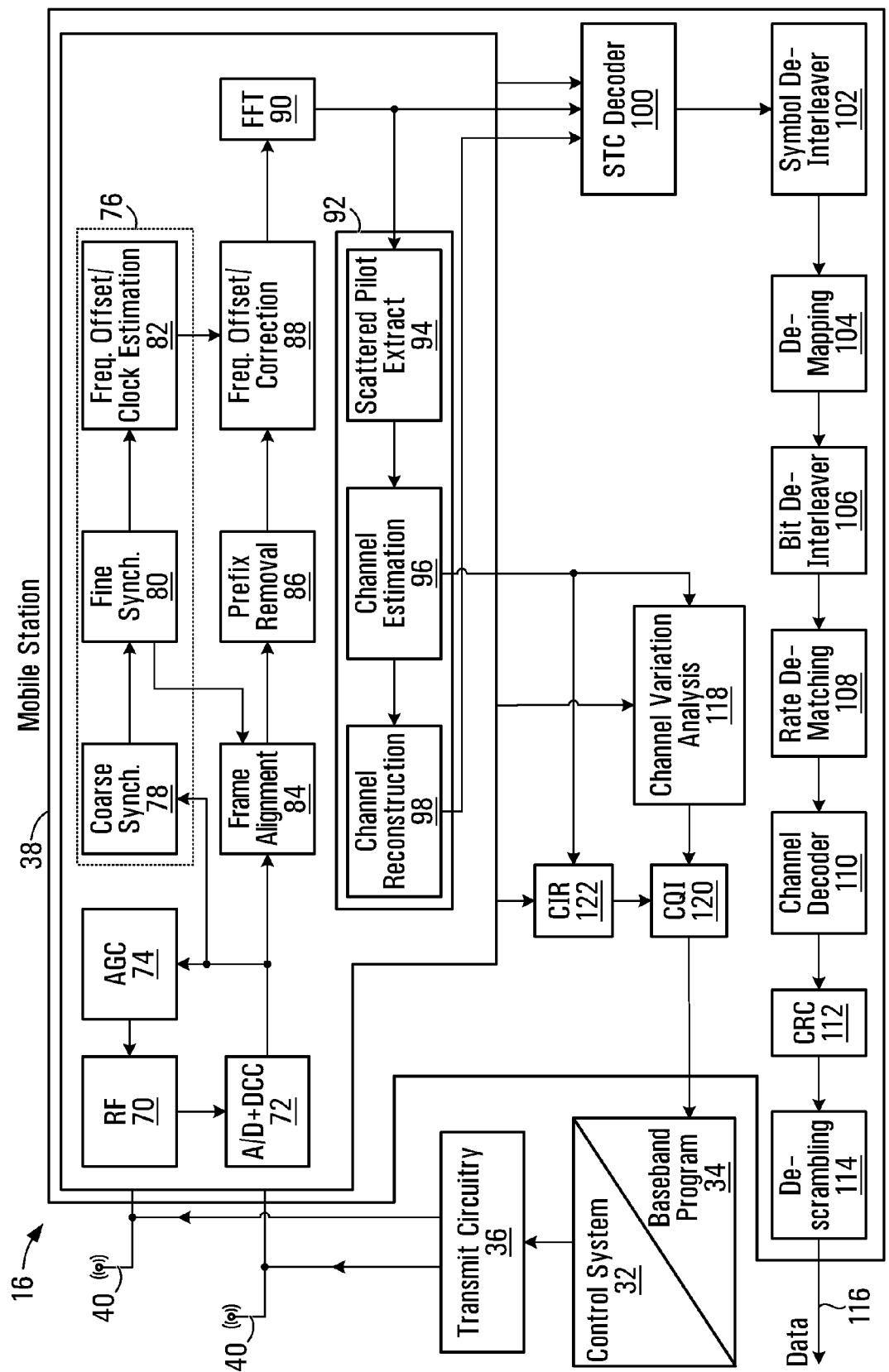
FIG. 6 is a block diagram of a logical breakdown of an example OFDM receiver architecture that might be used to implement some embodiments of the present application.
Figure 7:
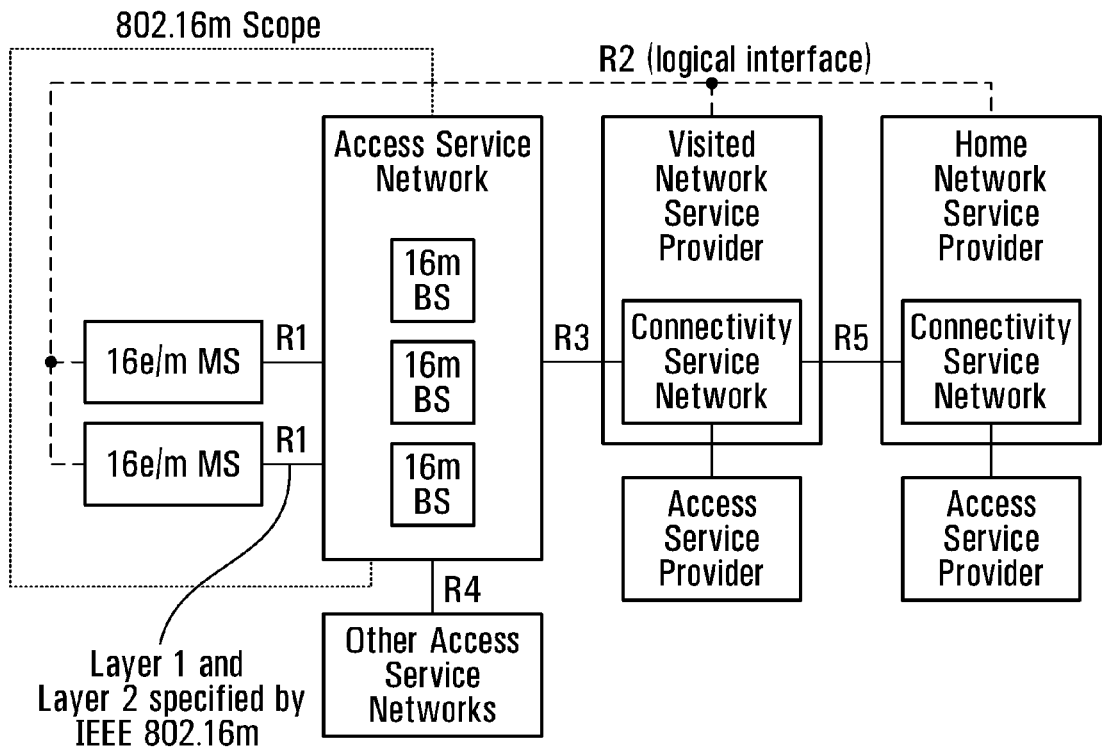
FIG. 7 is FIG. 1 of IEEE 802. 16m-08/003r1, an Example of overall network architecture.
Figure 8:
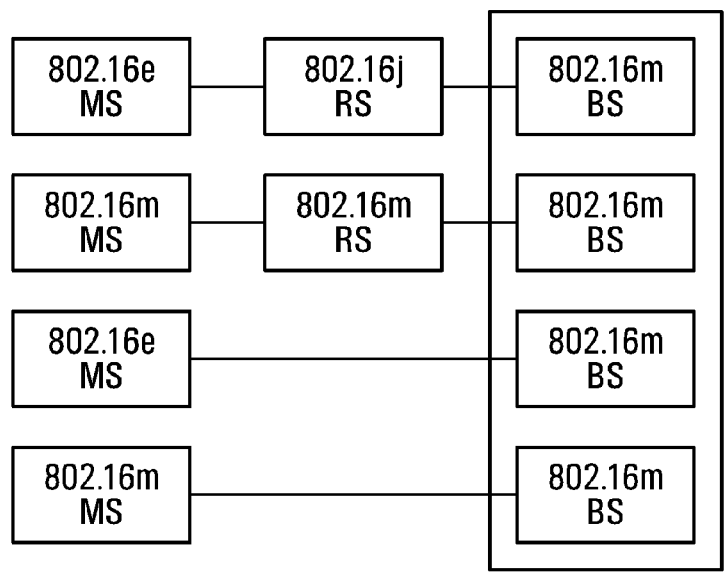
FIG. 8 is FIG. 2 of IEEE 802. 16m-08/003r1, a Relay Station in overall network architecture.
Figure 9:
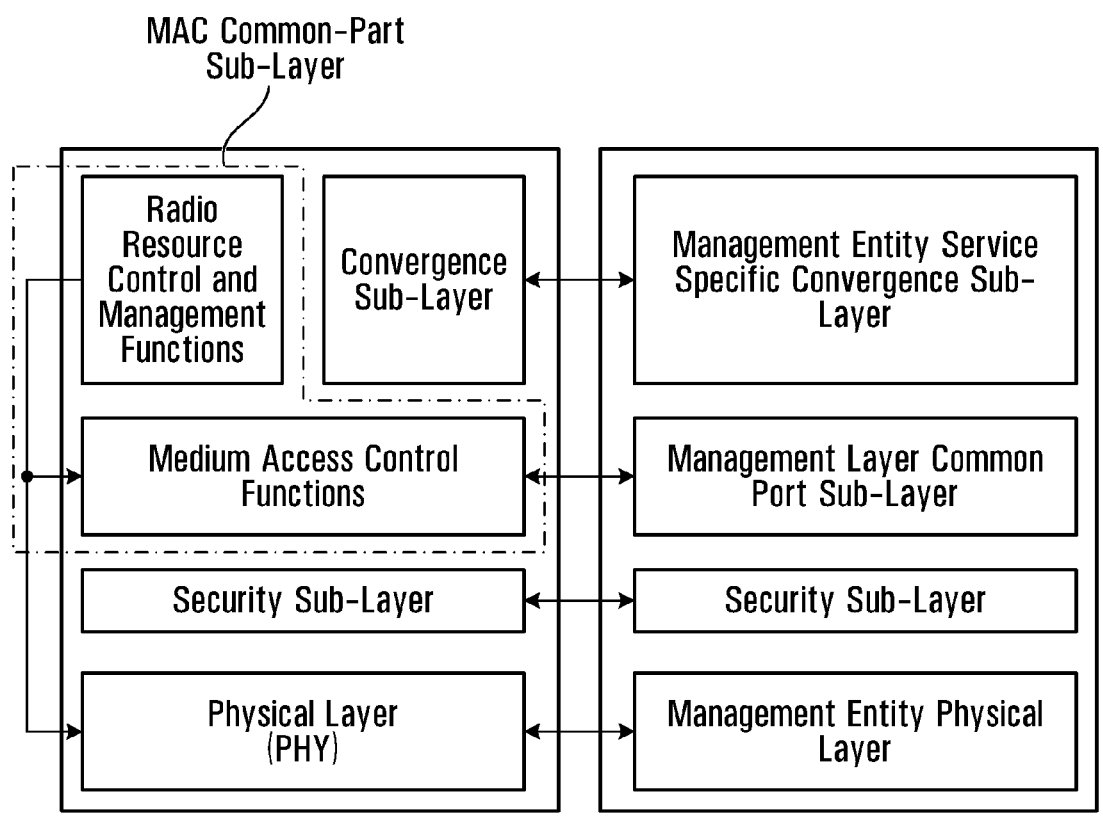
FIG. 9 is FIG. 3 of IEEE 802. 1 6m-08/003r1, a System Reference Model.
Figure 10:
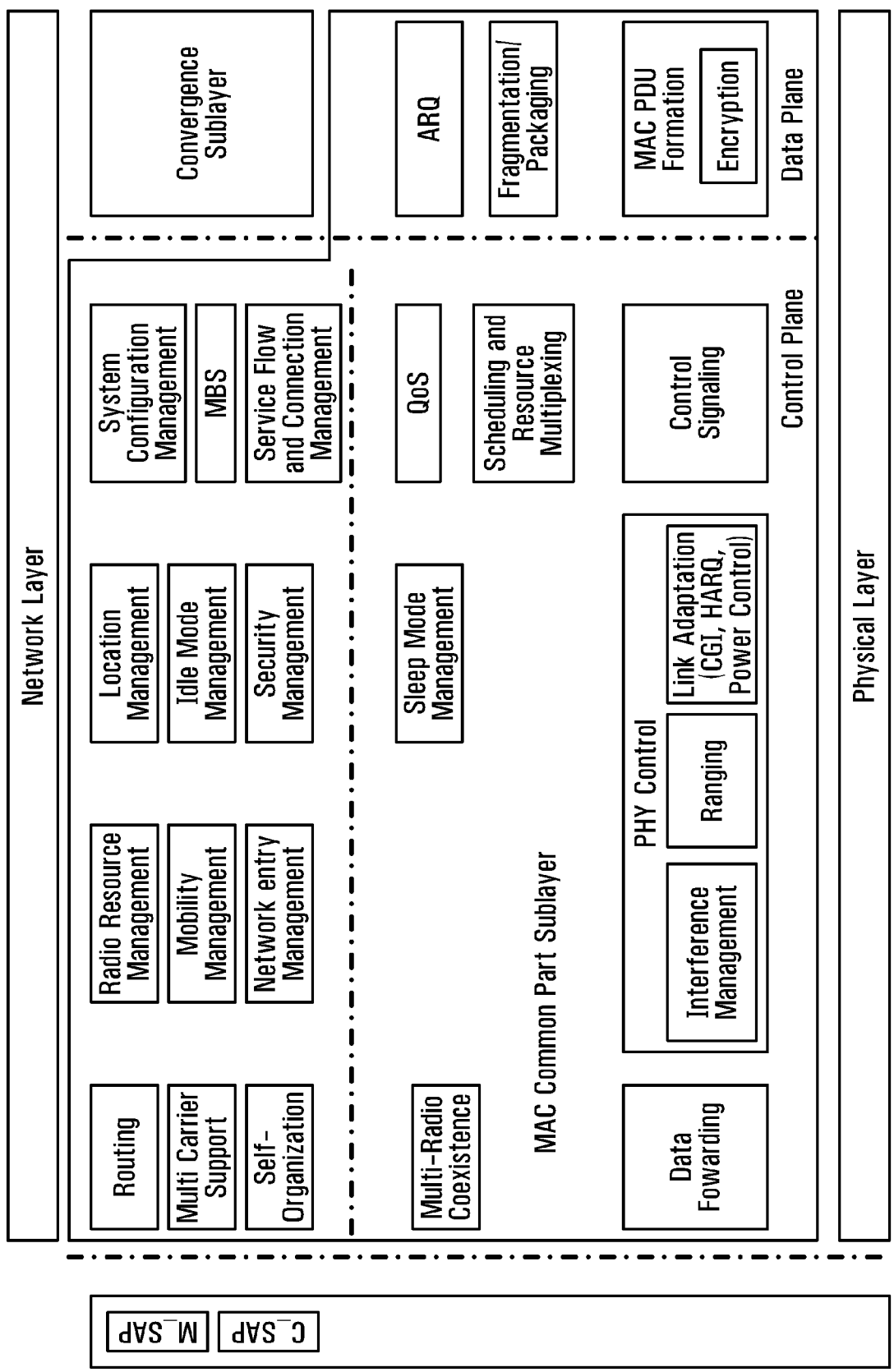
FIG. 10 is FIG. 4 of IEEE 802.16m-08/003r1, The IEEE 802.16m Protocol Structure.
Figure 11:
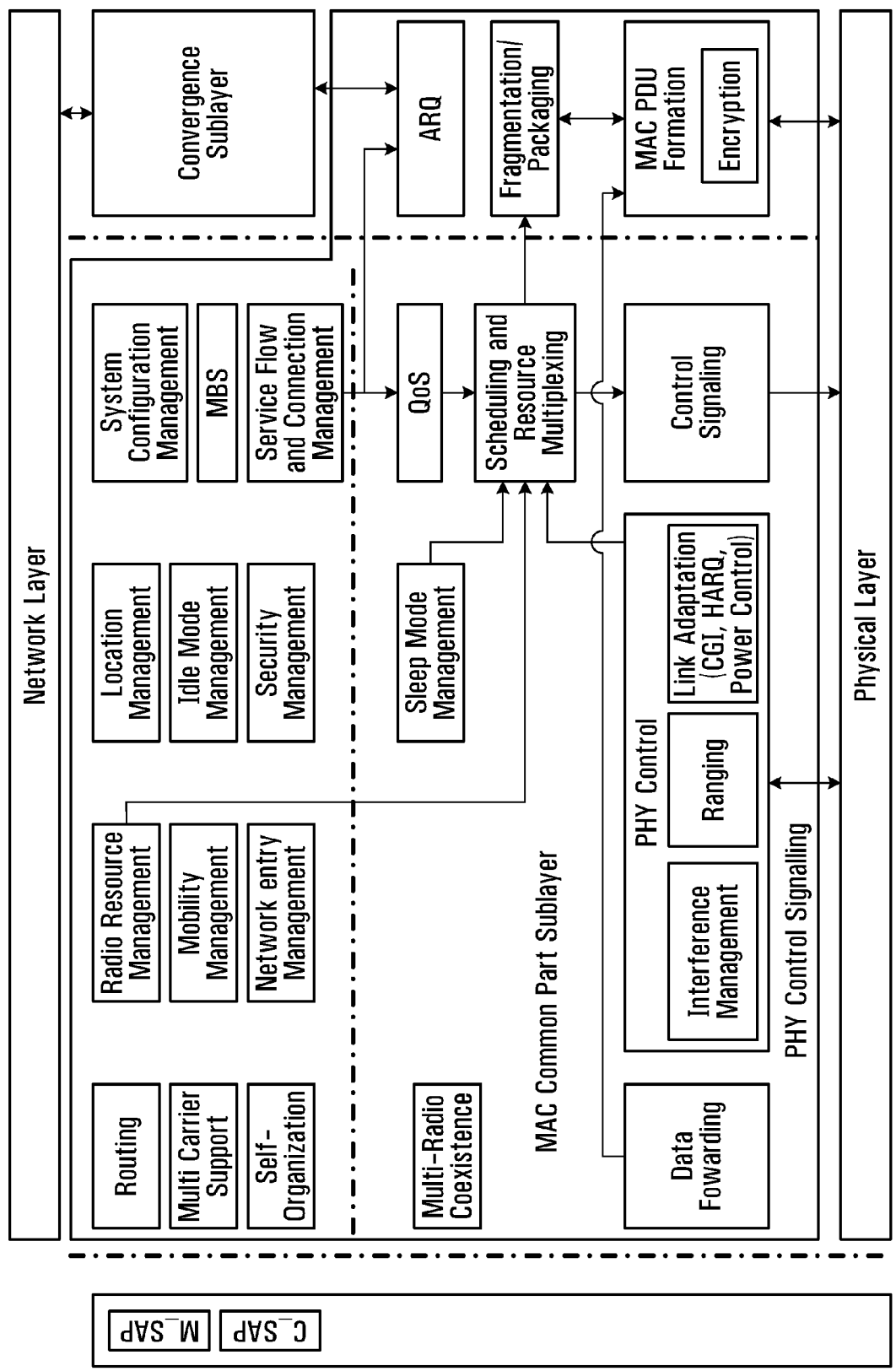
FIG. 11 is FIG. 5 of IEEE 802. 16m-08/003r1, The IEEE 802. 16m MS/BS Data Plane Processing flow.
Figure 12:
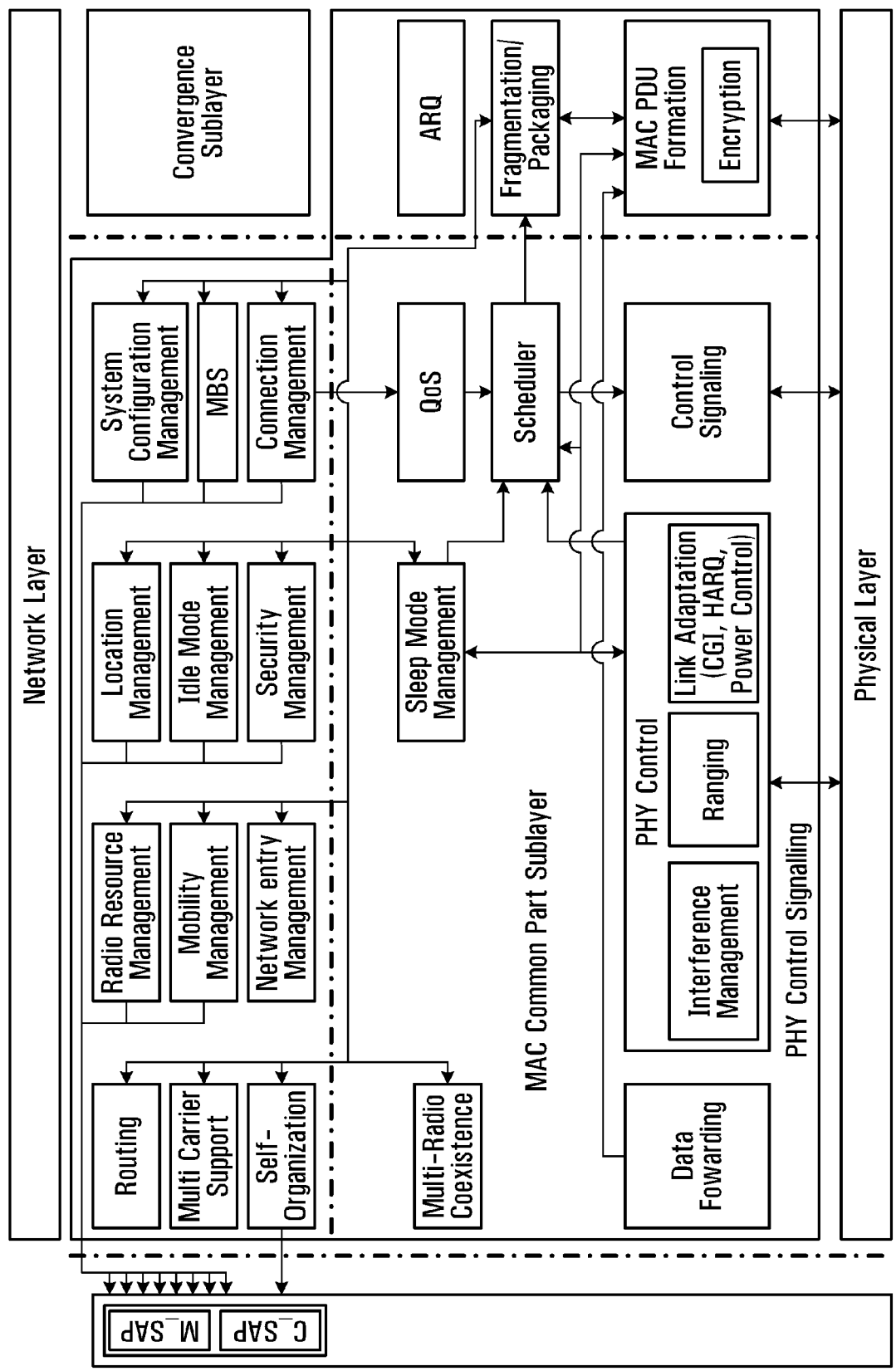
FIG. 12 is FIG. 6 of IEEE 802. 16m-08/003r1, The IEEE 802. 16m MS/BS Control Plane Processing Flow.
Figure 13:
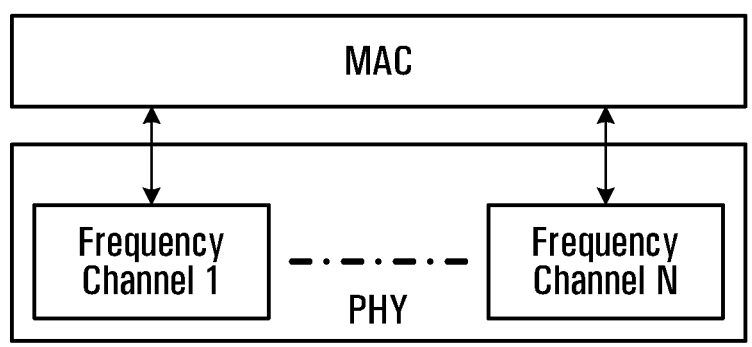
FIG. 13 is FIG. 7 of IEEE 802. 16m-08/003r1, Generic protocol architecture to support multicarrier system.

Reference is now made to FIG. 6 to illustrate reception of the transmitted signals by a mobile terminal 16, either directly from base station 14 or with the assistance of relay 15. Upon arrival of the transmitted signals at each of the antennas 40 of the mobile terminal 16, the respective signals are demodulated and amplified by corresponding RF circuitry 70. For the sake of conciseness and clarity, only one of the two receive paths is described and illustrated in detail. Analog-to-digital (ADC) converter and down-conversion circuitry 72 digitizes and downconverts the analog signal for digital processing. The resultant digitized signal may be used by automatic gain control circuitry (AGC) 74 to control the gain of the amplifiers in the RF circuitry 70 based on the received signal level.

Initially, the digitized signal is provided to synchronization logic 76, which includes coarse synchronization logic 78, which buffers several OFDM symbols and calculates an auto-correlation between the two successive OFDM symbols. A resultant time index corresponding to the maximum of the correlation result determines a fine synchronization search window, which is used by fine synchronization logic 80 to determine a precise framing starting position based on the headers. The output of the fine synchronization logic 80 facilitates frame acquisition by frame alignment logic 84. Proper framing alignment is important so that subsequent FFT processing provides an accurate conversion from the time domain to the frequency domain. The fine synchronization algorithm is based on the correlation between the received pilot signals carried by the headers and a local copy of the known pilot data. Once frame alignment acquisition occurs, the prefix of the OFDM symbol is removed with prefix removal logic 86 and resultant samples are sent to frequency offset correction logic 88, which compensates for the system frequency offset caused by the unmatched local oscillators in the transmitter and the receiver. Preferably, the synchronization logic 76 includes frequency offset and clock estimation logic 82, which is based on the headers to help estimate such effects on the transmitted signal and provide those estimations to the correction logic 88 to properly process OFDM symbols.

At this point, the OFDM symbols in the time domain are ready for conversion to the frequency domain using FFT processing logic 90. The results are frequency domain symbols, which are sent to processing logic 92. The processing logic 92 extracts the scattered pilot signal using scattered pilot extraction logic 94. determines a channel estimate based on the extracted pilot signal using channel estimation logic 96, and provides channel responses for all sub-carriers using channel reconstruction logic 98. In order to determine a channel response for each of the sub-carriers, the pilot signal is essentially multiple pilot symbols that are scattered among the data symbols throughout the OFDM sub-carriers in a known pattern in both time and frequency. Continuing with FIG. 6, the processing logic compares the received pilot symbols with the pilot symbols that are expected in certain sub-carriers at certain times to determine a channel response for the sub-carriers in which pilot symbols were transmitted. The results are interpolated to estimate a channel response for most, if not all, of the remaining sub-carriers for which pilot symbols were not provided. The actual and interpolated channel responses are used to estimate an overall channel response, which includes the channel responses for most, if not all, of the sub-carriers in the OFDM channel.

The frequency domain symbols and channel reconstruction information, which are derived from the channel responses for each receive path are provided to an STC decoder 100, which provides STC decoding on both received paths to recover the transmitted symbols. The channel reconstruction information provides equalization information to the STC decoder 100 sufficient to remove the effects of the transmission channel when processing the respective frequency domain symbols.

The recovered symbols are placed back in order using symbol de-interleaver logic 102, which corresponds to the symbol interleaver logic 58 of the transmitter. The de-interleaved symbols are then demodulated or de-mapped to a corresponding bitstream using dc-mapping logic 104. The bits are then dc-interleaved using bit de-interleaver logic 106, which corresponds to the bit interleaver logic 54 of the transmitter architecture. The de-interleaved bits are then processed by rate dc-matching logic 108 and presented to channel decoder logic 110 to recover the initially scrambled data and the CRC checksum. Accordingly, CRC logic 112 removes the CRC checksum, checks the scrambled data in traditional fashion, and provides it to the de-scrambling logic 114 for descrambling using the known base station de-scrambling code to recover the originally transmitted data 116.

In parallel to recovering the data 116, a CQI or at least information sufficient to create a CQI at the base station 14, is determined and transmitted to the base station 14. As noted above, the CQI may be a function of the carrier-to-interference ratio (CR). as well as the degree to which the channel response varies across the various sub-carriers in the OFDM frequency band. For this embodiment, the channel gain for each sub-carrier in the OFDM frequency band being used to transmit information is compared relative to one another to determine the degree to which the channel gain varies across the OFDM frequency band. Although numerous techniques are available to measure the degree of variation, one technique is to calculate the standard deviation of the channel gain for each sub-carrier throughout the OFDM frequency band being used to transmit data.

In some embodiments, a relay station may operate in a time division manner using only one radio, or alternatively include multiple radios.

FIGS. 1 to 6 provide one specific example of a communication system. It is to be understood that particular embodiments of the application can be implemented with communications systems having architectures that are different than the specific example, but that operate in a manner consistent with the implementation of the embodiments as described herein.

FIGS. 7-13 of the present application correspond to FIGS. 1-7 of IEEE 802.16m-08/003r1. The description of these figures found in IEEE 802. 16m-08/003r1 is incorporated herein by reference. Particular embodiments described in further detail below may be implemented in an architecture such as that shown in FIGS. 7-13.

Various specific embodiments will now be described in the context of the wireless systems described above.

When applying channel coding in systems such as those described above (for example, in channel encoder 50), it may be beneficial to use a Reed-Muller (RM) error control code to encode small packets or small sequences of data requiring robust protection against channel noise. Notably, for small sequences of data, RM codes have a relatively large minimum Hamming distance and a relatively fast decoding algorithm. An example of a small packet that may benefit from encoding using a Reed-Muller code is a control packet transmitted on the uplink from the mobile terminal 16 to the base station 14.

Consider a Reed-Muller (RM) block code RM(m,r) having an order r and a codeword length $n=2^m$. RM codes are well known in the art, and it will be appreciated that the RM code can be considered to be an (n, k) block code in which $n=2^m$ is the codeword length and $$k = \sum_{i=0}^{r} \binom{m}{i}.$$

Such a block code can encode up to k bits of information with a total of $2^k$ codewords. The RM codebook consists of all of the codewords produced by the RM code and will be designated P. The minimum hamming distance between any two codewords in P is $2^{m-r}$.

Non-coherent detection may be used in channels in which the sequence of data is being transmitted from the sender to the receiver. However, decoding ambiguity may occur if a RM code is used directly in a system that implements non-coherent detection due to the increased likelihood of the presence of more than one maximum correlation amplitude in the non-coherent decision metric.

Therefore, instead of transmitting the sequence of data using a RM code, a new sub-codebook G is constructed using the codebook P of the RM code, and the sequence of data to be transmitted is instead encoded using the new sub-codebook G. The sub-codebook G is constructed from P such that each codeword g in G has an autocorrelation amplitude that is different from, and in fact higher than, each correlation amplitude between g and each of the other codewords in G. In the specific example above for which the codebook P is that of a RM code, this reduces the likelihood of the presence of more than one maximum correlation amplitude when computing the non-coherent decision metric during decoding.

Figure 14:
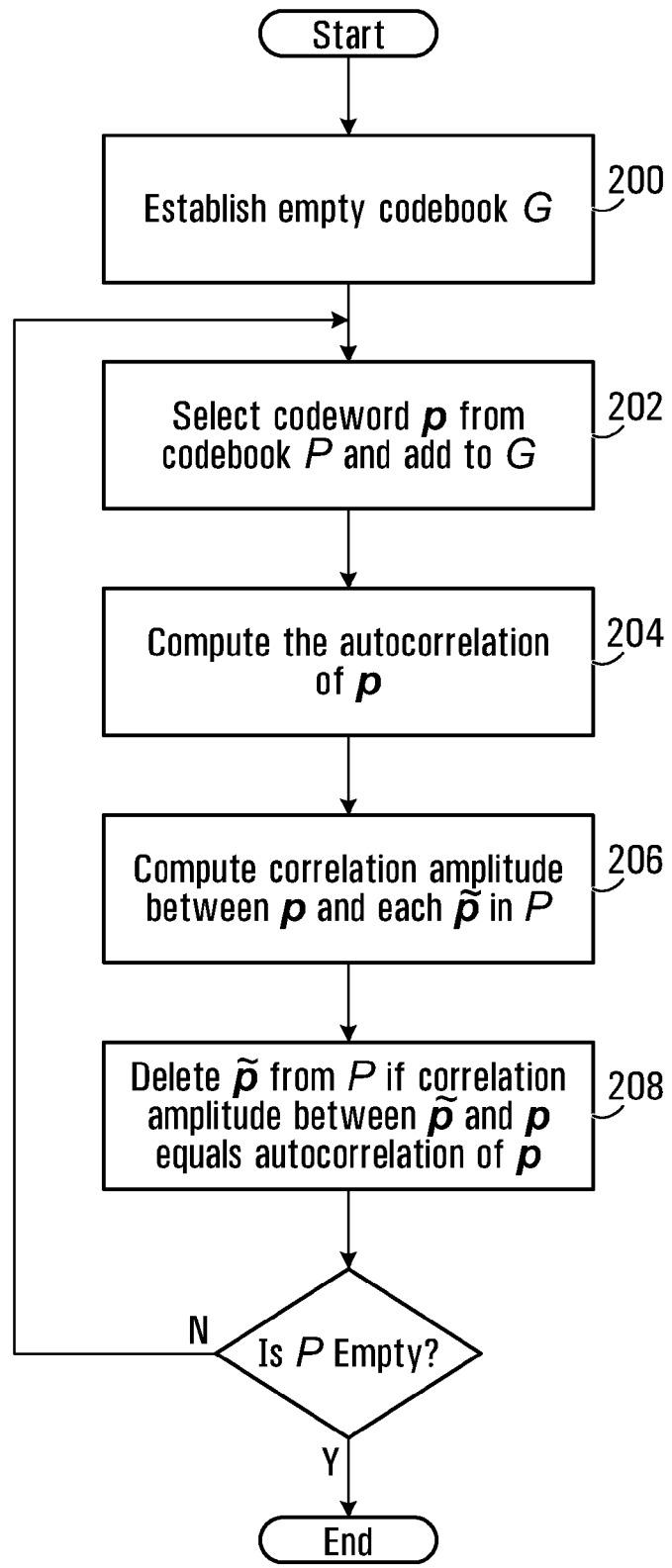
FIG. 14 is a flow diagram outlining a method for constructing a sub-codebook G from a codebook P.

A method for constructing a sub-codebook G from a codebook P of an error control code is shown in FIG. 14. As an example, this method can be performed on a processing unit. In one embodiment, the processing unit is the baseband processor 34 on mobile terminal 16.

Turning therefore to FIG. 14, first in step 200, an empty codebook G is established. For example, if the method is performed in baseband processor 34, a designated area of memory in the mobile terminal 16 can be reserved for codebook G. G initially has no codewords.

Next, in step 202, a codeword p is selected from codebook P and added to codebook G. The selected codeword may or may not be deleted from codebook P. As will be made clear below, if the selected codeword p is not deleted from codebook P, it will be deleted in step 208.

In step 204, an auto-correlation amplitude of codeword p is then computed.

Then, in step 206, a correlation amplitude is calculated between codeword p and each codeword $\hat{p}$ in P.

In step 208, any codeword p̃ in P is deleted from P if the correlation amplitude calculated between p and p̃ equals the auto-correlation amplitude of p.

Steps 202 to 208 are repeated until all codewords have been deleted from codebook P.

In this way, using the method of FIG. 14, a codeword from P is added to sub-codebook G at each iteration until all of the codewords in P have been deleted. This construction ensures that each codeword p added to G will have an autocorrelation amplitude that is different from (and higher than) each correlation amplitude between p and each of the other codewords in G.

In one embodiment, the method of FIG. 14 is performed in advance of operation of the mobile terminal 16, in which case the new sub-codebook G is stored in memory on the mobile terminal 16 and is accessible by the baseband processor 34.

Figure 15:
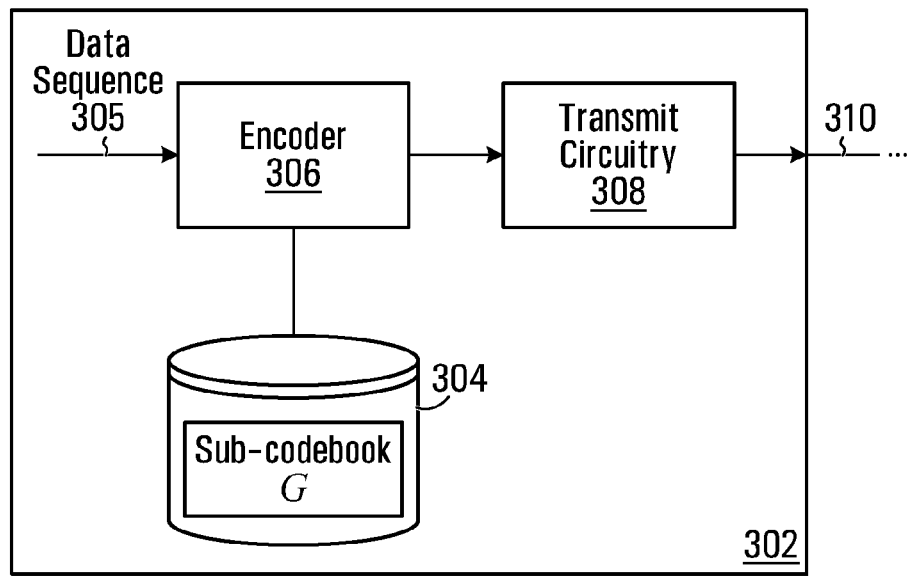
FIG. 15 is an embodiment of device configured to encode and transmit data.

FIG. 15 shows an embodiment of a device 302 in which sub-codebook G is stored thereon in memory 304. Sub-codebook G has been constructed as described in FIG. 14. The device 302 includes an encoder 306 which is configured to map a sequence of data 305 to be encoded to a codeword in the codebook G. The device 302 further includes transmit circuitry 308 for transmitting the codeword over a channel 310. It will be appreciated that the memory 304 may instead be located in the encoder 306 itself and that the sub-codebook G stored in memory 304 may comprise only a generating matrix for generating codewords in G. In one specific embodiment, in the context of the system described with reference to FIGS. 1-6, the device 302 is the mobile terminal 16, the encoder 306 is part of the baseband processor 34, and the transmit circuitry 308 is transmit circuitry 36.

Figure 16:
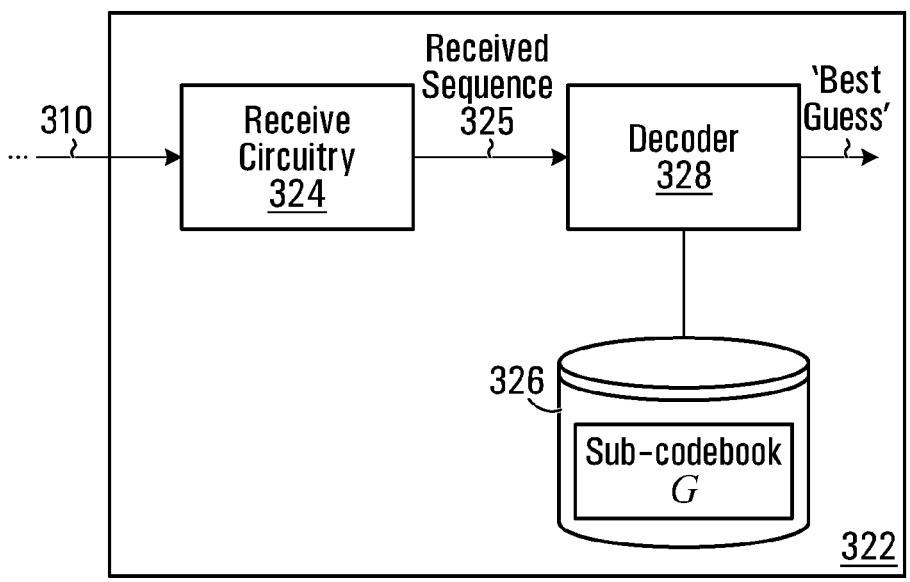
FIG. 16 is an embodiment of a device configured to receive and decode data.

FIG. 16 shows an example embodiment of a device 322 for receiving and decoding the encoded sequence of data (i.e. the codeword) transmitted over channel 302. The device 322 includes receive circuitry 324 for receiving the sequence of data 325 from the channel 302, as well as memory 326 for storing the codebook G of the error control code. The device 322 further includes a decoder 328 configured to compute, for each codeword in the codebook G, a correlation value between the sequence 325 and the codeword. As is the case with the device 302, it will be appreciated that the memory 326 may instead be located in the decoder 328 itself and that the sub-codebook G stored in memory 326 may comprise only a generating matrix for generating codewords in G. The decoder 328 selects the codeword in the codebook G resulting in the highest correlation value. In one specific embodiment, in the context of the system described with reference to FIGS. 1-6, the device 322 is the base station 14, the decoder 328 is part of the baseband processor 22, and the receive circuitry 324 is receive circuitry 26.

Figure 17:
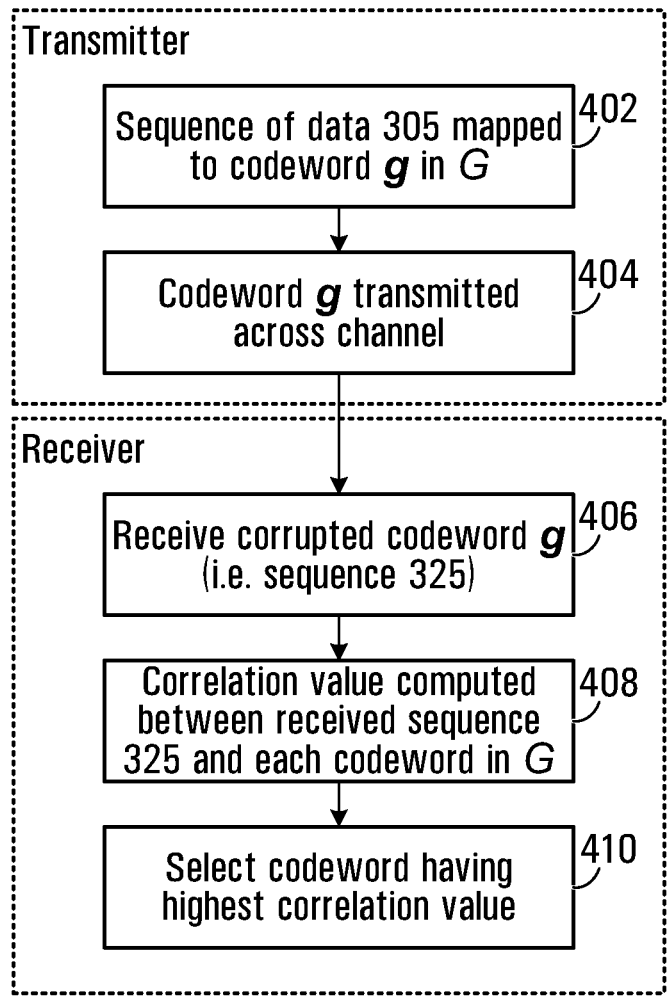
FIG. 17 is a flow diagram outlining the operation of the devices shown in FIGS. 16 and 17.

FIG. 17 outlines the operation of the device of FIG. 15 (the transmitter) and the device of FIG. 16 (the receiver). Steps 402 and 404 of FIG. 17 are performed by the transmitter.

First, in step 402, a sequence of data 305 is mapped (for example, by encoder 306) to a codeword g in codebook G. Then, in step 404, the codeword g is transmitted over the channel (for example, using transmit circuitry 308).

The codeword g, which represents an encoded sequence of the data, is corrupted by noise in the channel and is received at the receiver (for example, via receive circuitry 324). This is shown in step 406. The received sequence of data 325 obtained is operated upon, as shown in steps 408 and 410, for example, by decoder 328.

First in step 408, for each codeword in G, a correlation value is computed between the received sequence 325 and the codeword. Then, in step 410, the codeword is selected that results in the highest correlation value. This selected codeword represents the 'best guess' of the receiver.

A specific example will now be described below in the context of an OFDM system, such as that shown in FIGS. 1-6.

For the purpose of this example, it is assumed that a set of subcarriers of an OFDM resource space is divided into sub-resource spaces, each referred to herein as a "tile"; each tile has J subcarriers.

For the purpose of transmitting an uplink control packet, a selected codeword is transmitted by the mobile station 16 to the base station 14 using/of the tiles, as described in detail below, and using J QPSK symbols per tile (one per subcarrier), for a total of I×J QPSK symbols. In the example below, J is 16 and I is 2, 4, 6, or 8, but it should be clearly understood that these are simply implementation examples.

Specifically, in this example the mobile terminal 16 transmits QPSK symbol $p_{ij}$ at data tone j of a tile i, where i=1, ..., I, I∈{2,4,6,8} and j=1, ..., J where J=16.

The baseband processor 34 selects a codeword p=$[p_{ij}]$∈G, where G is the set of possible codewords determined using the method of FIG. 14. The notation $[p_{ij}]$ refers to such a set of I×J QPSK symbols.

Let $y_{ijk}$ be the symbol received at receive antenna number k at the base station 14. $y_{ijk}$ corresponds to QPSK symbol $p_{ij}$ transmitted at data tone j of tile i. Base station 14 implements a non-coherent receiver and therefore uses $y_{ijk}$ from each receive antenna to make a 'best guess' as to which codeword p was sent by selecting the codeword satisfying the following decision metric:

$$\hat{p} = \underset{P=[p_{ij}]\in G}{\operatorname{argmax}} \sum_{i,k} \left| \sum_j p_{ij}^* y_{ijk} \right|^2.$$

As explained above, the method of FIG. 14 is used to construct codebook G, which is a sub-codebook of a code P, such as a RM code. In this specific example, when constructing codebook G from P via the method of FIG. 14, during step 204, the auto-correlation amplitude of codeword p is computed as $$\sum_t |p_t|^2$$

where $p_t$, t=1, 2, ... T, is a QPSK data symbol in the set of T QPSK symbols corresponding to the codeword p∈P. During step 206 of FIG. 14, the correlation amplitude between the codeword p∈P and codeword p̃∈P is computed according to the formula:

$$\sum_t |p_t^* \tilde{p}_t|,$$

where $\tilde{p}_t$ is a QPSK data symbol in the set of T QPSK symbols corresponding to the codeword p̃∈P and where $p_t^*$ is the complex conjugate of $p_t$.

As described earlier, the method of FIG. 14 can be performed using a RM codebook P. For a first order RM code, it can be shown that the RM codebook P can be partitioned into four independent sub-codebooks G1, G2, G3, and G4 for QPSK. G1 can be generated by performing the method of FIG. 14 using RM codebook P. G2 can be generated by performing the method of FIG. 14 using the codebook P\{G1}, that is the set of codewords in codebook P minus the codewords in G1. G3 can be then generated by performing the method of FIG. 14 using the RM codebook P\{G1,G2}, and so on.

It will be appreciated that although some of the specific examples discussed above are described in the context of a RM code, the technique of FIG. 14 can be applied to a codebook P of other error control codes, including both linear and non-linear, and non-binary codes. Examples include the quadratic residual code, the Golay code, and the family of BCH codes Also, the specific example embodiment described in the context of an OFDM system above has been described in the context of a QPSK modulation scheme. However, it will be appreciated that the technique described in FIG. 14 is independent of the modulation scheme utilized.

Moreover, it will be appreciated that the "channel" described with reference to FIGS. 15-17 is not limited only to a data communication channel, but can be considered any medium in which an encoded data sequence is transmitted or stored thereon and subsequently received or read therefrom.

Finally, although the foregoing has been described with reference to certain specific embodiments, various modifications thereof will be apparent to those skilled in the art without departing from the scope of the claims appended hereto.

The invention claimed is:

1. A method of encoding data using an error control code, the method being performed in a transmitter and comprising:
   mapping a sequence of the data to a codeword from a codebook G of the error control code; and
   forwarding the codeword for transmission over a channel;
   wherein the codebook G is a sub-codebook of another codebook P, wherein each codeword g in the sub-codebook G has an autocorrelation amplitude that is different from and higher than each correlation amplitude between g and each of the other codewords in the sub-codebook G, and
   wherein the sub-codebook G was generated from the codebook P by:
   (a) establishing an empty sub-codebook G;
   (b) selecting a codeword from codebook P and including the codeword from codebook P in sub-codebook G;
   (c) computing the autocorrelation amplitude of the codeword from codebook P;
   (d) computing the correlation amplitude between the codeword from codebook P and each codeword in codebook P, and deleting from codebook P each codeword in codebook P for which the correlation amplitude is equal to the auto-correlation amplitude; and
   (e) repeating operations (b) to (d) until all of the plurality of codewords are deleted from codebook P.

2. The method of claim 1 wherein the codebook P is a codebook of a Reed-Muller code.

3. The method of claim 1 wherein the autocorrelation amplitude is computed as $$\sum_t |p_t|^2,$$

and wherein the correlation amplitude is computed as $$\sum_t |p_t^* \tilde{p}_t|,$$

where $p_t$, t=1, 2, . . . T, is a data symbol of a set of T data symbols associated with the codeword from codebook P included in sub-codebook G, where $p_t^*$ is the complex conjugate of $p_t$, and where $\tilde{p}_t$ is a data symbol of a set of T data symbols associated with a codeword in code book P.

4. The method of claim 3 wherein the codeword is transmitted using Orthogonal Frequency-Division Multiplexing (OFDM).

5. The method of claim 1 wherein the sequence of data comprises a control packet.

6. The method of claim 1 wherein forwarding the codeword for transmission over a channel further comprises:
   modulating the codeword using Quadrature Phase Shift Key (QPSK) modulation; and
   transmitting the modulated codeword.

7. The method of claim 1, wherein the channel is associated with a cellular communication network.

8. A method of decoding a sequence of data received over a communication channel, the sequence having been encoded using an error control code prior to transmission over the communication channel, the method being performed in a receiver and comprising:
   obtaining the sequence of data that was received over the communication channel;
   for each codeword in a codebook G of the error control code, computing a correlation value between the sequence and the codeword; and
   selecting a codeword in the codebook G associated with the highest correlation value of the computed correlation values;
   wherein the codebook G is a sub-codebook of another codebook P, wherein each codeword g in the sub-codebook G has an autocorrelation amplitude that is different from and higher than each correlation amplitude between g and each of the other codewords in the sub-codebook G, and
   wherein the sub-codebook G was generated from the codebook P by:
   (a) establishing an empty sub-codebook G;
   (b) selecting a codeword from codebook P and including the codeword from codebook P in sub-code book G;
   (c) computing the autocorrelation amplitude of the codeword from codebook P;
   (d) computing the correlation amplitude between the codeword from codebook P and each codeword in codebook P, and deleting from codebook P each codeword in codebook P for which the correlation amplitude is equal to the auto-correlation amplitude; and
   (e) repeating operations (b) to (d) until all of the plurality of codewords are deleted from codebook P.

9. The method of claim 8 wherein the method is performed in a receiver that implements non-coherent detection and wherein the codebook P is a codebook of a Reed-Muller code.

10. The method of claim 9 wherein the sequence of data is received using Orthogonal Frequency-Division Multiplexing (OFDM), and wherein the correlation value is computed as $$\sum_{i,k} \left| \sum_j p_{ij}^* y_{ijk} \right|^2,$$

where $p_{ij}$ is a data symbol of a tile i and a data tone j, and $y_{ijk}$ is the value of $p_{ij}$ received at an antenna k of the receiver.

11. The method of claim 8 wherein the autocorrelation amplitude is computed as $$\sum_t |p_t|^2,$$

and wherein the correlation amplitude is computed as $$\sum_t |p_t^* \tilde{p}_t|,$$

where $p_t$, $t=1, 2, \ldots T$, is a data symbol of a set of T data symbols associated with the codeword from codebook P included in sub-codebook G, where $p_t^*$ is the complex conjugate of $p_t$, and where $\tilde{p}_t$ is a data symbol of a set of T data symbols associated with a codeword in code book P.

12. The method of claim 8 further comprising decoding the sequence of data utilizing the selected codeword in the codebook G resulting in the highest correlation value.

13. The method of claim 12 further comprising forwarding the decoded sequence of data to a descrambling logic module effective to descramble the decoded sequence of data and recover alternate data associated with the sequence of data.

14. The method of claim 13, wherein the decoded sequence of data includes a cyclic redundancy check (CRC) checksum.

15. A device in a data communication system configured to encode data using an error control code, the device comprising:
   memory for storing a codebook G of the error control code;
   an encoder configured to map a sequence of the data to a codeword from the codebook G; and
   transmit circuitry for transmitting the codeword over a channel;
   wherein the codebook G is a sub-codebook of another codebook P, wherein each codeword g in the sub-codebook G has an autocorrelation amplitude that is different from and higher than each correlation amplitude between g and each of the other codewords in the sub-codebook G, and
   wherein the sub-codebook G stored in the memory was previously generated from the code book P by:
     (a) establishing an empty sub-codebook G;
     (b) selecting a codeword from codebook P and including the codeword from codebook P in sub-code book G;
     (c) computing the autocorrelation amplitude of the codeword from codebook P;
     (d) computing the correlation amplitude between the codeword from codebook P and each codeword in codebook P, and deleting from codebook P each codeword in codebook P for which the correlation amplitude is equal to the auto-correlation amplitude; and
     (e) repeating operations (b) to (d) until all of the plurality of codewords are deleted from codebook P.

16. The device of claim 15 wherein the codebook P is a codebook of a Reed-Muller code.

17. The device of claim 16 further comprising a plurality of transmit antennas, and wherein the transmit circuitry is configured to transmit the codeword over the channel using Orthogonal Frequency-Division Multiplexing (OFDM).

18. The device of claim 15, wherein the sequence of data comprises a control packet.

19. The device of claim 15, the device further configured to:
   modulate the codeword using Quadrature Amplitude modulation; and
   transmit the modulated codeword utilizing the transmit circuitry.

20. The device of claim 15, wherein the device comprises a mobile terminal associated with at least one wireless communication system.

* * * * *